(12) United States Patent
Kilzer et al.

(10) Patent No.: US 8,710,863 B2
(45) Date of Patent: Apr. 29, 2014

(54) CONFIGURABLE LOGIC CELLS

(75) Inventors: Kevin Lee Kilzer, Chandler, AZ (US);
Sean Steedman, Phoenix, AZ (US);
Jerrold S. Zdenek, Riverside, IL (US);
Vivien N. Delport, Chandler, AZ (US);
Zeke Lundstrum, Chandler, AZ (US);
Fanie Duvenhage, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/449,993

(22) Filed: Apr. 18, 2012

(65) Prior Publication Data
US 2012/0268163 A1  Oct. 25, 2012

Related U.S. Application Data

(60) Provisional application No. 61/477,821, filed on Apr. 21, 2011.

(51) Int. Cl.
*G06F 7/38* (2006.01)
*H03K 19/173* (2006.01)

(52) U.S. Cl.
USPC .................................. 326/37; 326/38; 326/47

(58) Field of Classification Search
None
See application file for complete search history.

(56) References Cited

U.S. PATENT DOCUMENTS

| | | | |
|---|---|---|---|
| 4,292,548 A | 9/1981 | Suarez et al. | 326/37 |
| 5,298,805 A | 3/1994 | Garverick et al. | 307/465 |
| 5,910,732 A | 6/1999 | Trimberger | 326/38 |
| 6,260,087 B1 * | 7/2001 | Chang | 710/100 |
| 6,467,009 B1 * | 10/2002 | Winegarden et al. | 710/305 |
| 6,476,634 B1 | 11/2002 | Bilski | 326/40 |
| 6,798,240 B1 | 9/2004 | Pedersen | 326/39 |
| 6,803,785 B1 | 10/2004 | May et al. | 326/39 |
| 6,948,147 B1 | 9/2005 | New et al. | 716/117 |
| 7,028,281 B1 | 4/2006 | Agrawal et al. | 326/41 |
| 7,119,575 B1 | 10/2006 | Schleicher et al. | 326/41 |
| 7,689,726 B1 | 3/2010 | Sundararajan et al. | 710/8 |
| 7,812,635 B1 | 10/2010 | Hutton et al. | 326/39 |
| 7,873,811 B1 | 1/2011 | Wolinski et al. | 712/15 |
| 8,026,739 B2 * | 9/2011 | Sullam et al. | 326/39 |
| 2003/0062922 A1 | 4/2003 | Douglass et al. | 326/39 |
| 2008/0136449 A1 | 6/2008 | Hutton et al. | 326/47 |
| 2008/0263334 A1 | 10/2008 | Synder et al. | 712/221 |
| 2012/0271968 A1 | 10/2012 | Kilzer et al. | 710/12 |

FOREIGN PATENT DOCUMENTS

EP          03/06962 A2   3/1989   ............. G06F 15/78

OTHER PUBLICATIONS

International PCT Search Report and Written Opinion, PCT/US2012/034245, 9 pages, Jun. 28, 2012.
International PCT Search Report and Written Opinion, PCT/US2012/034242, 12 pages, Aug. 2, 2012.
International PCT Search Report and Written Opinion, PCT/US2012/034367, 11 pages, Sep. 27, 2012.

(Continued)

*Primary Examiner* — Anh Tran
(74) *Attorney, Agent, or Firm* — King & Spalding L.L.P.

(57) ABSTRACT

A processor includes a RISC CPU core; and a plurality of peripherals including one or more configurable logic cell peripherals. The configurable logic cell peripheral may be configured to allow real-time software access to internal configuration and signals paths of the processor. The configurable logic cell peripheral may have real-time configuration control.

29 Claims, 7 Drawing Sheets

(56) References Cited

OTHER PUBLICATIONS

"UPSD3422, UPSD3433, UPSD3434, UPSD3454 Turbo Plus Series, Fast Turbo 8032 MCU with USB and Programmable Logic", www.st.com, 300 pages.

Xilinx, "XC9500 In-System Programmable CPLD Family," 14 pages, Jun. 1, 1996.
International Search Report and Written Opinion, Application No. PCT/US2012/034250, 9 pages, Dec. 14, 2012

* cited by examiner

CONFIGURABLE LOGIC CELLS

CROSS-REFERENCE TO RELATED APPLICATIONS

This application claims the benefit of U.S. Provisional Application No. 61/477,821 filed on Apr. 21, 2011, entitled "Configurable Logic Cells", which is incorporated by reference herein in its entirety. This application is related to co-pending U.S. patent application Ser. No. 13/449,687, filed on Apr. 18, 2012, entitled "Selecting Four Signals From Sixteen Inputs"; U.S. patent application Ser. No. 13/449,850, filed on Apr. 18, 2012 entitled "Configurable Logic Cells"; and U.S. patent application Ser. No. 13/450,079, filed on Apr. 18, 2013 entitled "A Logic Device For Combining Various Interrupt Sources Into A Single Interrupt Source And Various Signal Sources To Control Drive Strength", all filed concurrently herewith and incorporated by reference in their entirety.

BACKGROUND OF THE INVENTION

1. Field of the Invention

The present disclosure relates to configurable logic cells, and, more particularly, to a processor with a combinatorial logic peripheral, a configurable logic cell incorporated in a microprocessor and operating independently thereof, a configurable logic cell allowing software access to internal configuration and signal paths in an integrated circuit device, a configurable logic cell with real-time configuration control, and a configurable logic cell incorporating one or more logic functions.

2. Description of the Related Art

A processor system, such as a Reduced Instruction Set Computing (RISC) processor system, can include a microprocessor core and a plurality of peripherals.

The operation of a microprocessor is, from time to time, halted intentionally in order to (a) reduce power consumption (e.g., sleep or hibernate), or (b) allow inspection of internal registers by $3^{rd}$ party logic (e.g., debug freeze). In those instances, peripheral devices are generally also halted, either to simplify the logic interface, or to allow a "present state" to be captured for inspection.

Devices such as Field Programmable Gate Arrays (FPGA) and Programmable Logic Devices (PLD) provide configurable logic cells. Generally speaking, the design of the logic must explicitly provide for software inputs using registers, address buses, and other conventional microprocessor interface techniques, requiring additional FPGA resources be assigned to this feature. These conventional FPGA and PLD logic cells must be configured by the user, and that configuration remains static while the cell is in service.

FPGAs and PLDs provide configurable logic cells that are generally based on D flip-flop technology. While this is adequate for general purpose use and automated logic configuration, it does not always lead to a minimal circuit implementation solution.

As such, there is a need for improved systems and methods for providing configurable logic devices.

SUMMARY OF THE INVENTION

These and other drawbacks in the prior art are overcome in large part by a system and method according to embodiments of the present invention.

A processor in accordance with embodiments as claimed includes a RISC CPU core; and a plurality of peripherals including one or more configurable logic cell peripherals. In some embodiments, the configurable logic cell peripheral may be configured to allow real-time software access to internal configuration and signals paths of the processor. In some embodiments, the configurable logic cell peripheral has real-time configuration control.

In some embodiments, the configurable logic cell peripheral comprises a D-latch. In others, the configurable logic cell peripheral comprises a JK flip-flop. In general, the configurable logic cell may be programmable to function as one of a plurality of predetermined logic functions. In some embodiments, the configurable logic cell peripheral may operate independently of the processor. In some embodiments, the configurable logic cell peripheral may be configured to operate while the processor is in a sleep or freeze condition.

In some embodiments, the configurable logic cell peripheral may be configurable via one or more software registers. In others, the configurable logic cell peripheral may be configurable via non-volatile memory. The non-volatile memory may be statically connected for configuration. In some embodiments, the non-volatile memory may be read and configuration data transferred to configuration registers for configuring the configurable logic cell peripheral. In some embodiments, after initial configuration, the configuration of the configurable logic cell peripheral can be updated via software.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

Figure 1:
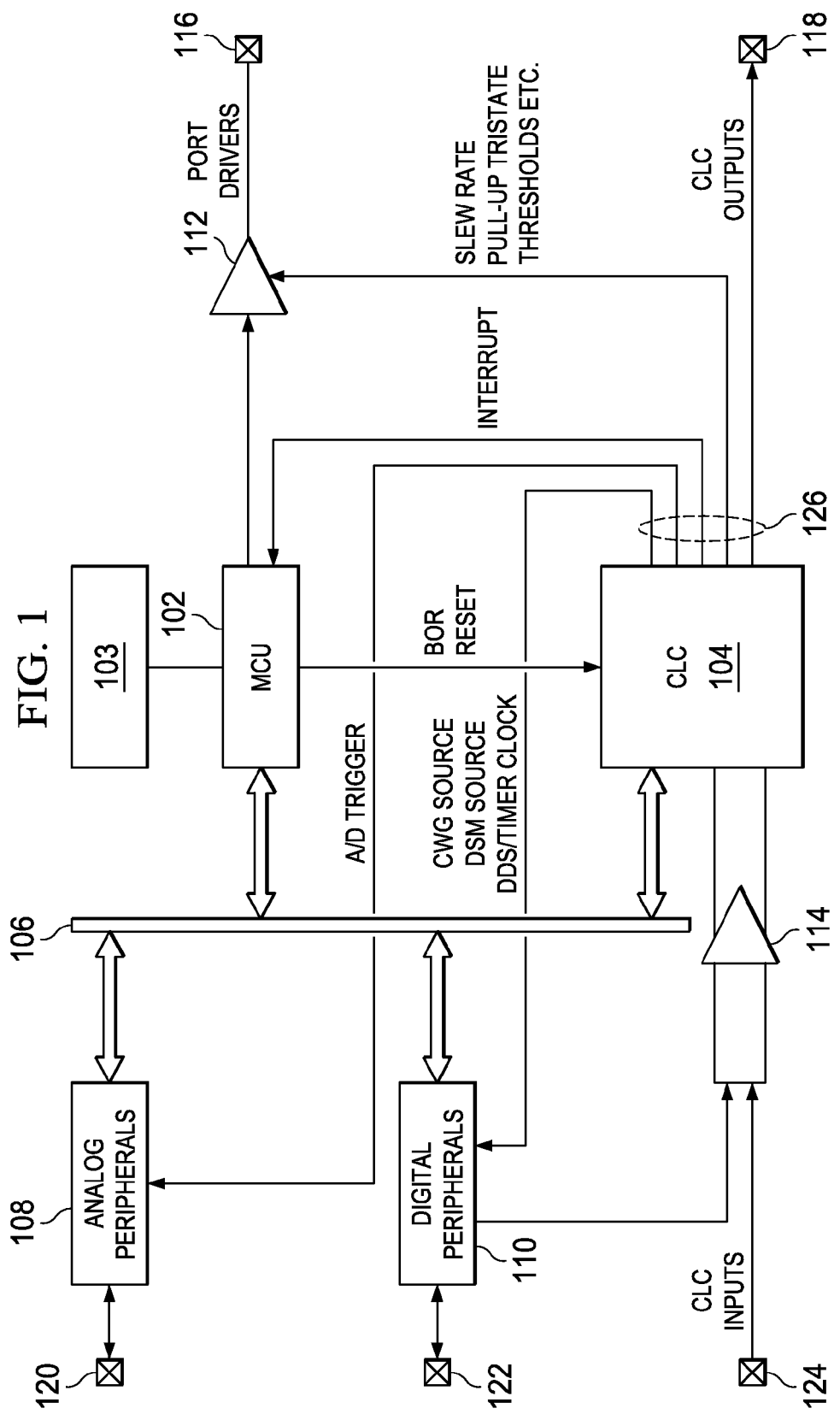
FIG. 1 illustrates an exemplary integrated circuit including a configurable logic cell.

Turning now to the drawings and, with particular attention to FIG. 1, a diagram of a processor or microcontroller 100 according to an embodiment of the present invention is shown. The processor 100 includes a processor core (MCU) 102, which may be embodied as a RISC core. The processor core 102 couples via a bus 106 to one or more on-chip peripheral devices, such as analog peripherals 108 and digital peripherals 110. The processor 100 may further include one or more on chip memory devices 103, which may be implemented as programmable flash memory.

In addition, as will be explained in greater detail below, the processor 100 further includes one or more configurable logic cells (CLC) 104, functioning as peripheral devices and coupled to the bus 106. That is, the configurable logic cells 104 are addressable like other peripheral devices and provide logic functions for the system. As will be discussed in greater detail below, the configurable logic cells 104 are programmable to implement a variety of logic functions. These can include, for example, AND, OR, XOR functions, and D, JK, and SR storage.

The processor 100 further includes one or more input and/or outputs 116, 118, 120, 122, 124, and associated port drivers, input controls 114, etc.

In the embodiment illustrated, the configurable logic cell 104 receives inputs from external pin 124, digital peripherals 110, and a reset from the processor core 102. These can include, for example, Complementary Waveform Generator (CWG) source, Data Signal Modulator (DSM) source, and Direct Digital Synthesis (DDS)/Timer clock inputs. In general, inputs can come from I/O pins, register bits, other peripherals, and internal clocks.

In addition, the configurable logic cell 104 can provide digital outputs to one or more of the analog peripherals 108, the digital peripherals 110, and the processor core 102. Additional outputs (such as slew rate, pull-up tristate thresholds, etc.) can be provided to port drivers 112, while others can be provided to external pins 118.

Thus, in general, the configurable logic cell 104 can receive inputs from any subsystem such as a digital peripheral, I/O port, or internal status bits, or reset signals, including for example, oscillator output, system clocks, etc., and provides outputs to I/O pins, peripherals, a processor core interrupt, I/O port control functions, status signals, system clock, and even to other configurable logic cells (not shown).

As noted above, in some embodiments, the configurable logic cell 104 is addressed like other peripheral devices and may be configured at run-time. In some embodiments, the configurable logic cell 104 may be configured at run time using one or more special function registers (not shown). Thus, the configurable logic cell 104 is fully integrated into the processor address and data bus. Configuration can be applied statically or updated in real time based on the needs of the application.

In some embodiments, configuration of the configurable logic cell 104 can come from software registers or non-volatile memory. In some embodiments, the memory may be read and data transferred to configuration registers. In others, the memory may be statically connected for configuration (as in generic logic arrays/programmable logic arrays (GAL/PAL)). Further, in some embodiments, after an initial configuration, software may update the configuration.

Figure 2:
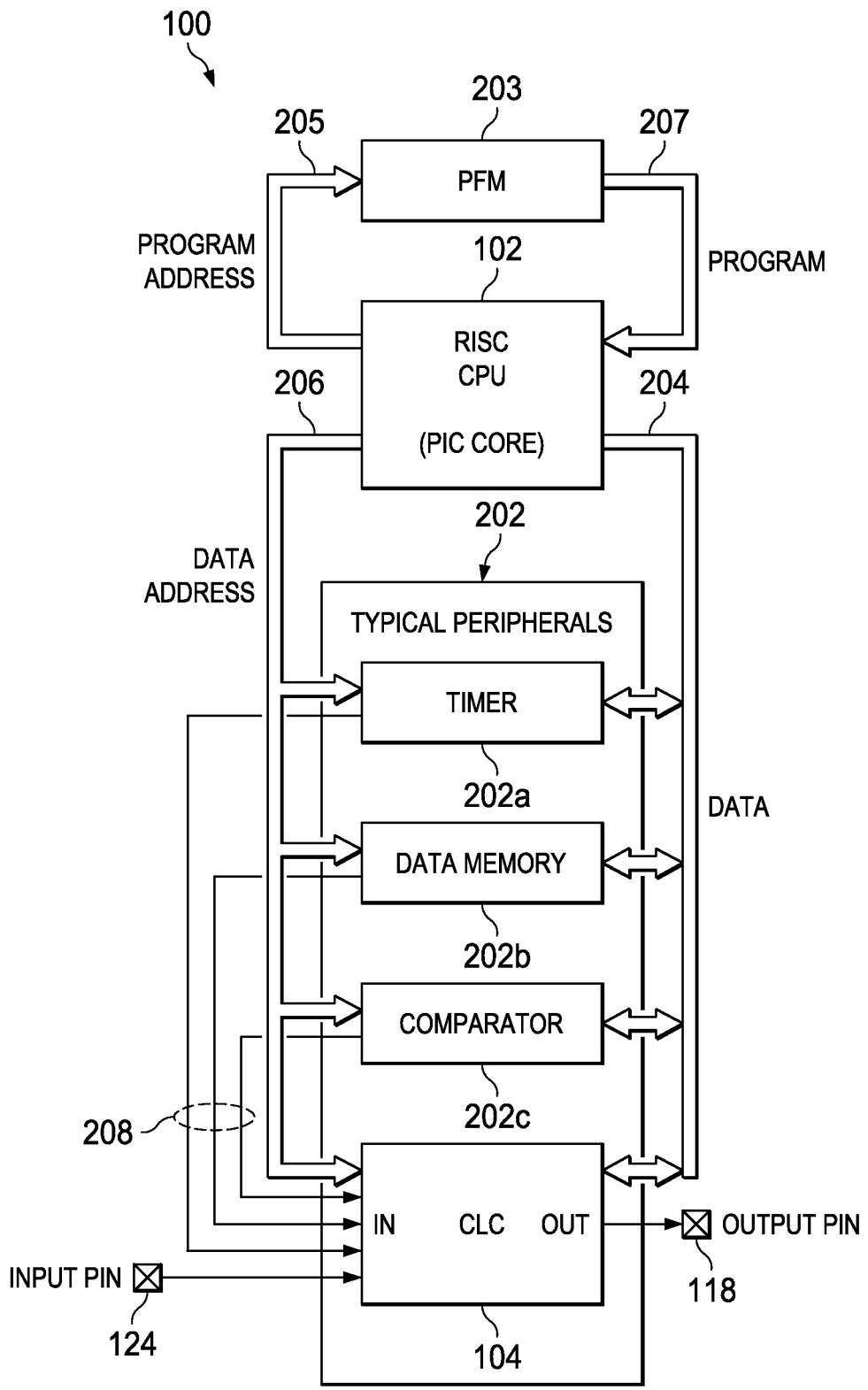
FIG. 2 illustrates an exemplary data and address lines in an integrated circuit including a configurable logic cell.

As such, in some embodiments, system signals and I/O signals are routed to the configurable logic cell 104, as shown in FIG. 2. The configurable logic cell 104 then performs the configured logic and provides an output. In particular, shown in FIG. 2 is processor 100 including processor core 102, a program flash memory 203, and peripherals 202. The program flash memory 203 couples via program address lines/bus 205 and program data lines/bus 207 to the processor core 102.

In the example illustrated, the peripherals include a timer 202a, data memory 202b, a comparator 202c, and the configurable logic cell 104. The peripherals couple to the processor core 102 by data address lines/bus 206 and data lines/bus 204. The configurable logic cell 104 may receive further individual inputs from the peripherals 208 or from an input pin 124. Thus, software and other peripherals can supply inputs to the configurable logic cell 104. The configurable logic cell 104 performs a configured logic operation and provides an output 312.

As noted above, the configurable logic cell implements one or more logic functions and can do so independently of the status of the processor core, e.g., while the processor core is in a sleep or debug mode. As will be discussed in greater detail below, the configurable logic cell includes Boolean logic programmable to implement a variety of functions, such as single gates, multiple gates, flip-flops, etc.

Figure 3:
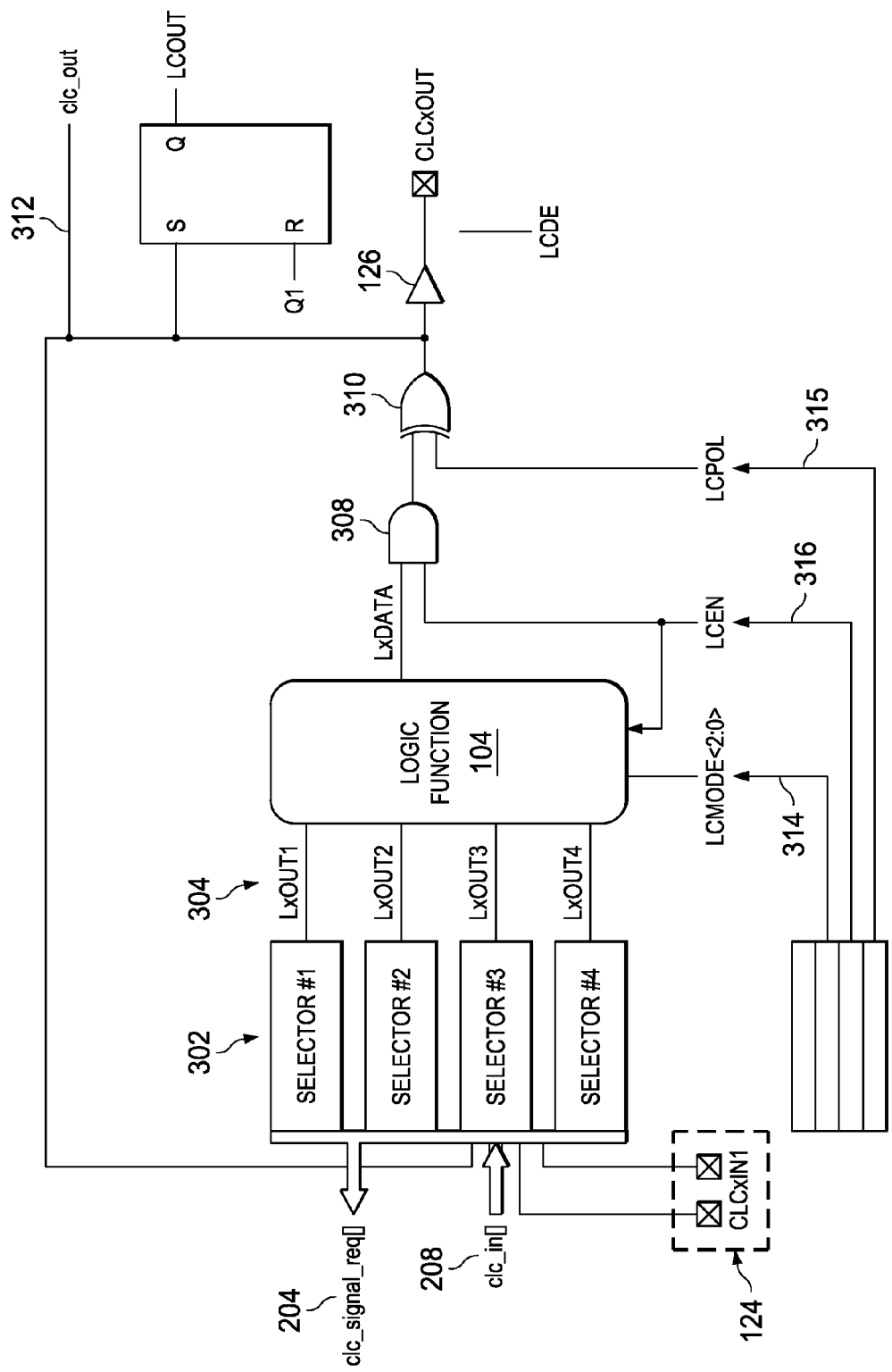
FIG. 3 illustrates an exemplary module including a configurable logic cell.

FIG. 3 illustrates the configurable logic cell environment according to one embodiment more particularly. Configurable logic cell 104 receives four channel inputs 304 LxOUT1, LxOUT2, LxOUT3, and LxOUT4 from a plurality of selectors 302. Inputs to the selectors 302 can come from signals 208 and I/O 124. In some embodiments, the selectors are multiplexers and/or configurable gates. For example, in some embodiments, the selectors 302 can reduce the number of inputs clc_in 208 from eight to four 304 to drive one of eight selectable single-output functions. Further details on particular implementations of the selectors 302 may be found in commonly-assigned, co-pending patent application Ser. No. 12/449,687, titled "Selecting Four Signals from Sixteen Inputs," filed Apr. 18, 2012, which is hereby incorporated by reference in its entirety as if fully set forth herein.

In the example illustrated, the configurable logic cell 104 receives control inputs LCMODE<2:0> 314 and LCEN 316 from one or more control registers 315. The output LxDATA of the configurable logic cell 104 is ANDed with the LCEN input 316. The output of AND gate 308 is XORed with LCPOL a control signal from a control register 315 and then output as CLCxOUT, all of which are explained in greater detail below.

As noted above, embodiments allow for real time configuration of the configurable logic cell. That is, configuration is provided through registers accessible from the microprocessor and can be updated based, for example, on external inputs, time of day, temperature of the system, coincidence with other events, or commands from a remotely controlling host.

Figure 4A:
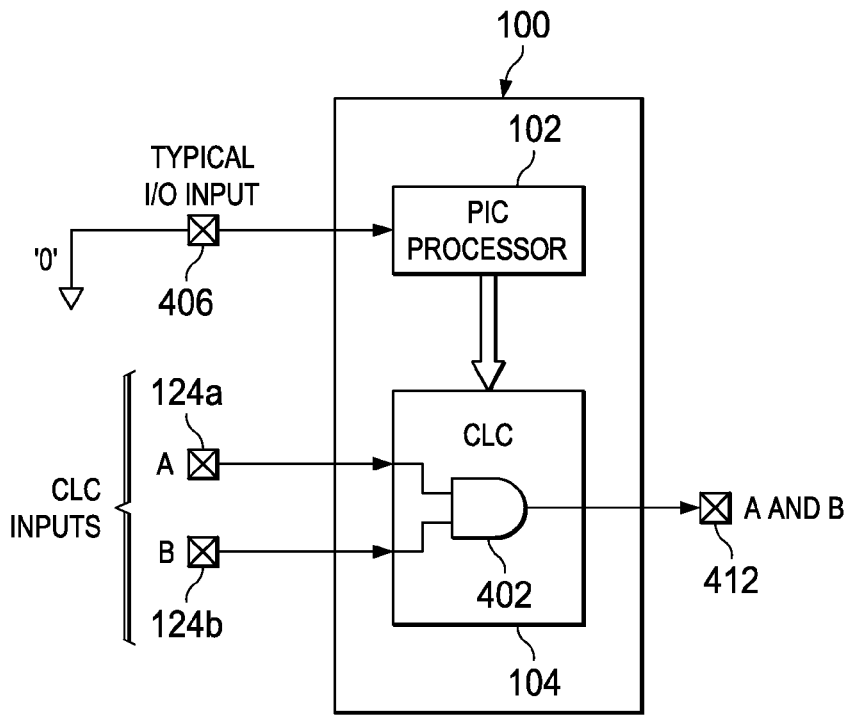
FIG. 4A and FIG. 4B illustrate software control and configuration of a configurable logic cell.
Figure 4B:
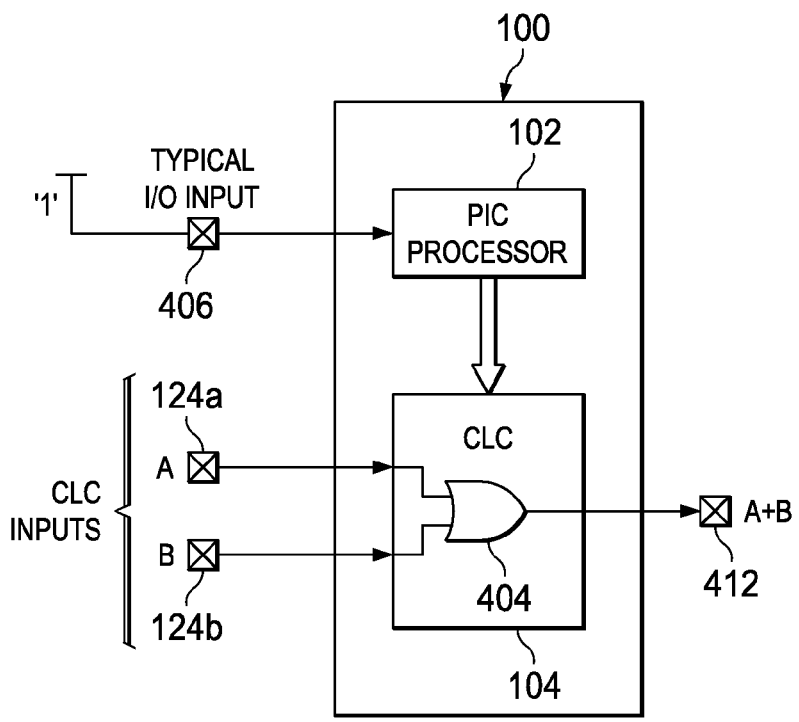

FIG. 4A and FIG. 4B schematically illustrate such operation. In particular, shown is processor 100 including processor core 102 and configurable logic cell 104. The processor 100 has an I/O input 406 to the processor core 102 and a pair of inputs 124a, 124b to the configurable logic core 104. The configurable logic cell 104 outputs to pin 412.

In operation, the state of the I/O pin 406 can be used to set the configurable logic core function. In the example illustrated, when the logic state of the I/O input 406 is "0", the processor core 102 writes to one or more registers (such as the LxMode register 314 of FIG. 3) to cause the configurable logic cell 104 to implement an AND function 402, so that the outputs on pin 412 is the logical AND of inputs A 124a and B 124b (AB). In contrast, when the logic state of the I/O input 406 is "1", the processor core 102 writes to one or more registers to cause the configurable logic cell 104 to implement an OR function 404, so that the output on pin 412 is the logical OR of inputs A 124a and B 124b (A+B). As can be appreciated, once the functions are set, the configurable logic cell 104 implements the configured function regardless of the functioning of the processor core 102.

Advantageously, the configurable logic cell 104 of embodiments of the present invention allows for dynamic configuration and direct access to software, allowing software to reconfigure individual gates and inverters while the system is running That is, the configurable logic cell of embodiments of the invention allows real-time software access to internal configuration and signal paths, without requiring a microprocessor interface.

Figure 5A:
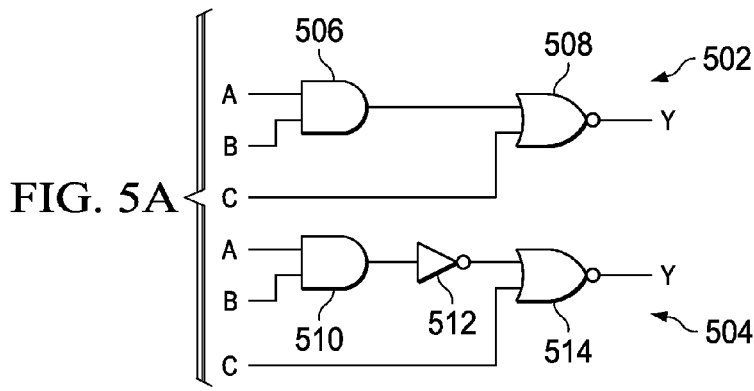
FIG. 5A and FIG. 5B illustrate exemplary logic functions for a configurable logic cell that replaces two statically configured functions with a single, software-controlled function.

For example, as shown in FIG. 5A, a static configuration of a microprocessor interface for implementing the two functions ((A*B)+C)' and ((A*B)'+C)' requires two versions 502, 504, including AND gates 506, 510, NOR gates 508, 514, and inverter 512.

Figure 5B:
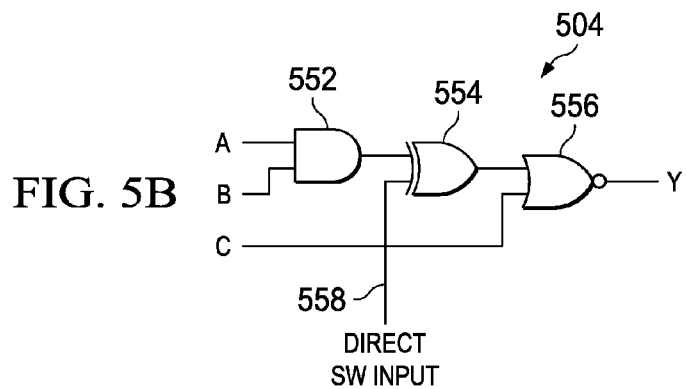

In contrast, an exemplary configurable logic cell 104 for implementing the functions is shown in FIG. 5B. The configurable logic cell 104 includes AND gate 552, XOR gate 554, and NOR gate 556. Inputs A and B are provided to AND gate 552, while input C is provided to the NOR gate 556. The output of the AND gate 552 is provided to the XOR gate 554, while the XOR gate 554 provides its output to the input of NOR gate 556. In addition, a direct software (SW) input 558 (e.g., from a control register) is provided to the input of the XOR gate 554. In this way, both functions of circuits 502, 504 are implemented using a single circuit and yet allowing direct software control.

Exemplary combinatorial options for a particular four-input configurable logic cell are shown in FIG. 6A-6D. More particularly, in some embodiments, a LxMODE<2:0> configuration register 314 (FIG. 3) defines the logic mode of the cell. When LxMODE=000, the configurable logic cell implements an AND-OR function. When LxMODE=001, the cell implements an OR-XOR function. When LxMODE=010, the cell implements an AND; when LxMODE=011, the cell is an RS latch.

Figure 7A:
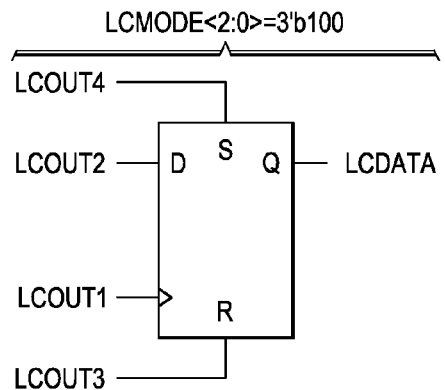
FIG. 7A-7D illustrate logic function state options for an exemplary configurable logic cell.

Correspondingly, the configurable logic cell 104 may incorporate a plurality of state logic functions. These are shown with reference to FIG. 7A-7D. The state functions include both D (FIG. 7A) and JK flipflops (FIG. 7B) with asynchronous set (S) and Reset (R). Input channel 1 (LCOUT1) provides a rising edge clock. If a falling edge is required, channel 1 (LCOUT1) can be inverted in the channel logic (not shown). Input channel 2 (LCOUT2), and sometimes channel 4 (LCOUT4), provide data to the register or latch inputs.

When LCMODE=100, the cell implements a one input D flipflop with S and R. When LCMODE=101, the cell implements a two input D flipflop with R. When LCMODE=110, the cell implements a JK flipflop with R. When LCMODE=111, the cell implements a one input transparent latch with S and R (The output Q follows D while LE is low and holds state while LE is high).

Figure 8:
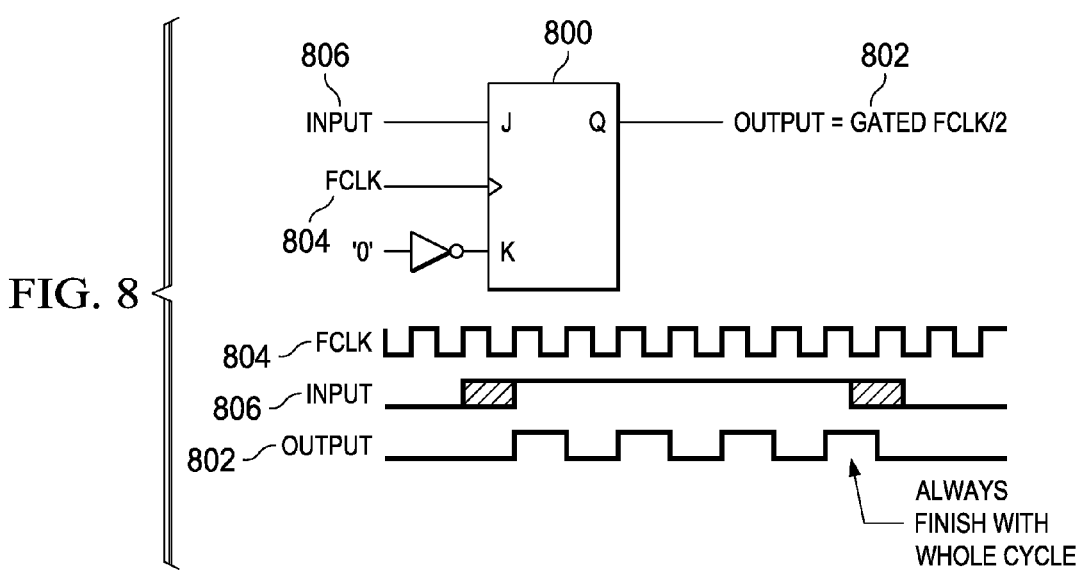
FIG. 8 illustrates an exemplary JK flip flop application and timing implemented with an exemplary configurable logic cell.
Figure 6A:
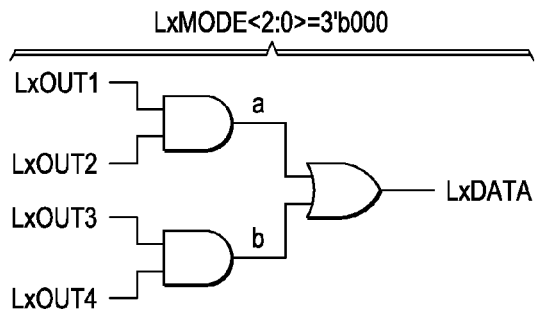
FIG. 6A-FIG. 6D illustrate logic function combinatorial options for an exemplary configurable logic cell.
Figure 6B:
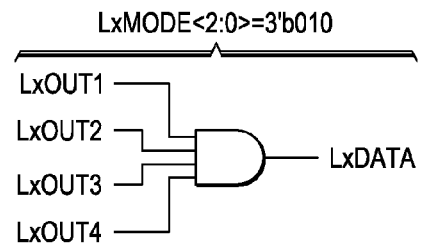
Figure 6C:
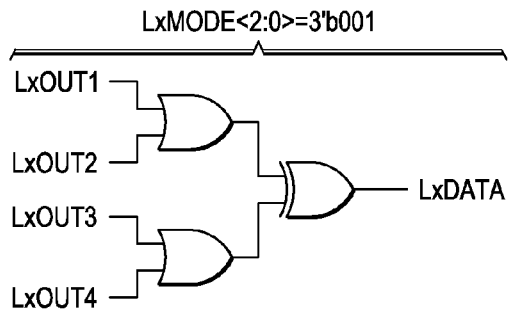
Figure 6D:
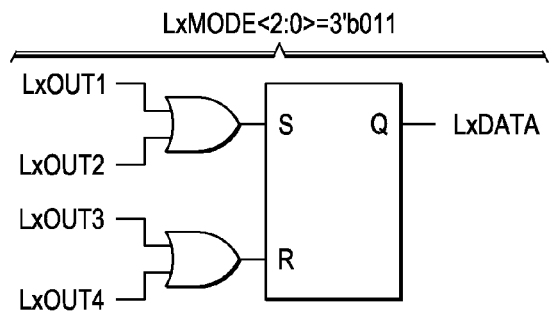

Finally, FIG. 8 illustrates an example operation of a JK flip-flop in accordance with embodiments of the invention. In particular, shown is a clock gating example including a JK flip flop 800, with input 806, output 802, and clock 804. The output 802 is a gated FCLK/2.

Figure 7B:
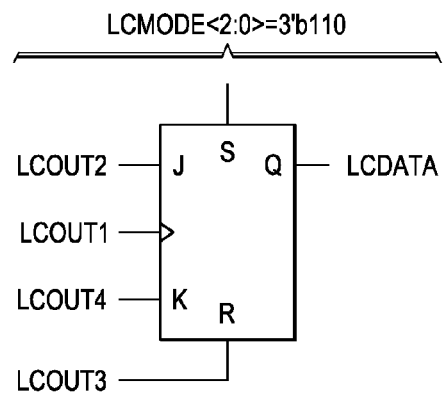
Figure 7C:
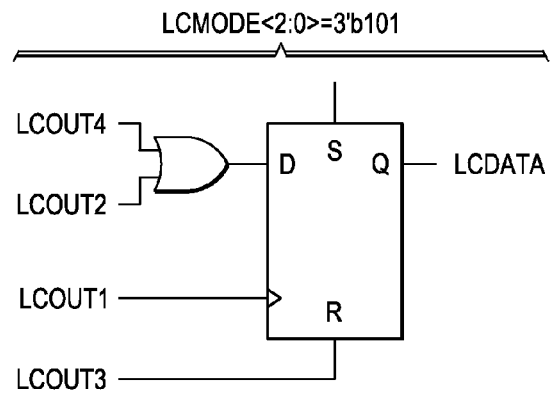
Figure 7D:
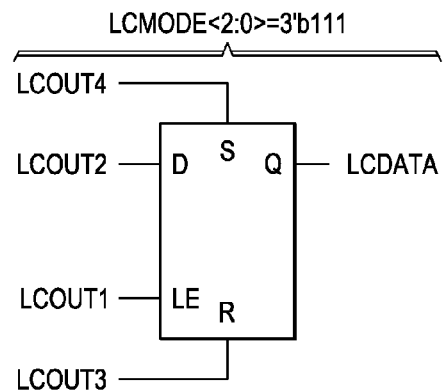

The JK flipflop can be configured according to FIG. 7B, with the clock at LCOUT1, J input at LCOUT2, and K input (inverted) at LCOUT4. As can be seen, the output 802 always includes a whole number of cycles. It is noted that other logic and state functions can be implemented. Thus, the figures are exemplary only.

While specific implementations and hardware/software configurations for the mobile computing device have been illustrated, it should be noted that other implementations and hardware configurations are possible and that no specific implementation or hardware/software configuration is needed. Thus, not all of the components illustrated may be needed for the mobile computing device implementing the methods disclosed herein.

As used herein, whether in the above description or the following claims, the terms "comprising," "including," "carrying," "having," "containing," "involving," and the like are to be understood to be open-ended, that is, to mean including but not limited to. Only the transitional phrases "consisting of" and "consisting essentially of," respectively, shall be considered exclusionary transitional phrases, as set forth, with respect to claims, in the United States Patent Office Manual of Patent Examining Procedures.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

What is claimed is:

1. A processor, comprising:
   a RISC CPU core;
   a plurality of peripherals, the plurality of peripherals including one or more configurable logic cell peripherals, wherein each of the one or more configurable logic cell peripherals comprises an associated configuration register and wherein a plurality of bits in said associated configuration register determines a logic function of the associated logic cell provided by a logic function block, wherein each logic function block has a plurality of logic inputs and a single logic output and a mode control input coupled with said plurality of bits of the associated configuration register.

2. A processor in accordance with claim 1, the configurable logic cell peripheral configured to allow real-time software access to internal configuration and signals paths of the processor.

3. A processor in accordance with claim 1, the configurable logic cell peripheral having real-time configuration control.

4. A processor in accordance with claim 1, the logic function block is programmable through the mode control input to operate as one of: a D-latch, a flip-flop, and a plurality of predetermined Boolean logic function circuit.

5. A processor in accordance with claim 1, the configurable logic cell peripheral operating independently of the processor.

6. A processor in accordance with claim 5, the configurable logic cell peripheral configured to operate while the processor is in a sleep or freeze condition.

7. A processor in accordance with claim 1, the configurable logic cell peripheral configurable via non-volatile memory.

8. A processor in accordance with claim 7, wherein the non-volatile memory is statically connected for configuration.

9. A processor in accordance with claim 7, wherein the non-volatile memory is read and configuration data is transferred to configuration registers for configuring the configurable logic cell peripheral.

10. A processor in accordance with claim 1, wherein after initial configuration, the configuration of the configurable logic cell peripheral can be updated via software.

11. A processor, comprising:
    a central processing unit (CPU) core;
    a plurality of peripherals couple via one or more buses to the CPU core, the plurality of peripherals including at least one configurable logic cell peripheral, wherein each of the one or more configurable logic cell peripherals comprises an associated configuration register and wherein a plurality of bits in said associated configuration register determines a logic function of the associated logic cell provided by a logic function block, wherein each logic function block has a plurality of logic inputs and a single logic output and a mode control input coupled with said plurality of bits of the associated configuration register.

12. A processor in accordance with claim 11, the at least one configurable logic cell peripheral configured to allow real-time software access to internal configuration and signals paths of the processor.

13. A processor in accordance with claim 11, the at least one configurable logic cell peripheral having real-time configuration control.

14. A processor in accordance with claim 11, the logic function block is programmable through the mode control input to operate as one of: a D-latch, a flip-flop, and a plurality of predetermined Boolean logic functions circuit.

15. A processor in accordance with claim 11, the at least one configurable logic cell peripheral operating independently of the processor.

16. A processor in accordance with claim 15, the at least one configurable logic cell peripheral configured to operate while the processor is in a sleep or freeze condition.

17. A method for use in a processor system, comprising:
setting one or more bits in a control register;
using the one or more bits in the control register to define functions implemented by a configurable logic cell, the functions comprising a plurality of combinatorial and logic function states, wherein depending on the bit setting in the control register the configurable logic cell is configured to perform a logic function provided by a logic function block, wherein the logic function block has a plurality of logic inputs and a single logic output and a mode control input for configuring the function.

18. A method in accordance with claim 17, wherein the logic function block comprises four logic inputs and a single logic output and can be configured to form a D-latch or a flip-flop, wherein the method further comprises setting the bits in said control register to configure the logic function block wherein
in a first configuration, the logic function block forms a D-flip-flop and
directly couples the first logic input with a set input of the D-flip-flop,
directly couples the second logic input with a data input of the D-flip-flop,
directly couples the third logic input with a clock input of the D-flip-flop, and
directly couples the fourth logic input with a reset input of the D-flip-flop, wherein an output of the D-flip-flop form the logic output of the logic function block;
in a second configuration, the logic function block forms a D-flip-flop and
a first AND gate having two inputs coupled with the first and the second logic input and an output coupled with a set input of the D-flip-flop; and
a second AND gate having two inputs coupled with the third and the fourth logic input and an output coupled with a reset input of the D-flip-flop;
in a third configuration, the logic function block forms a D-flip-flop and
a first AND gate having two inputs coupled with the first and the second logic input and an output coupled with a data input of the D-flip-flop;
to directly couple the third logic input with a clock input of the D-flip-flop, and
to directly couple the fourth logic input with a reset input or the D-flip-flop, wherein an output of the D-flip-flop foam the logic output of the logic function block;
in a fourth configuration, the logic function block forms a D-latch and
to directly couple the first logic input with a set input of the D-latch, to directly couple the second logic input with a data input of the D-latch,
to directly couple the third logic input with a latch enable input of the D-latch, and
to directly couple the fourth logic input with a reset input of the D-latch, wherein an output of the D-latch form the logic output of the logic function block;
and in a fifth configuration, the logic function block forms a JK-flip-flop and
to directly couple the first logic input with a J input of the JK-flip-flop,
to directly couple the second logic input with a clock input of the JK-flip-flop,
to directly couple the third logic input with a K input of the JK-flip-flop, and
to directly couple the fourth logic input with a reset input of the JK-flip-flop, wherein an output of the JK-flip-flop form the logic output of the logic function block.

19. A method in accordance with claim 18, wherein the logic function block is further configured
in a sixth mode to form
a first AND gate having two inputs coupled with a first and a second logic input and an output;
a second AND gate having two inputs coupled with a third and a fourth logic input and an output; and
an OR gate having two inputs coupled with the outputs of the first and second AND gate and having an output forming the logic output of the logic function block;
in a seventh mode to form
a first OR gate having two inputs coupled with a first and a second logic input and an output;
a second OR gate having two inputs coupled with a third and a fourth logic input and an output; and
an XOR gate having two inputs coupled with the outputs of the first and second OR gate and having an output forming the logic output of the logic function block; and
in a eighth mode to form
an AND gate having four inputs coupled with a first, second, third and fourth logic input, respectively and an output forming the logic output of the logic function block.

20. A method in accordance with claim 17, the configurable logic cell peripheral configurable via one or more software registers.

21. A method in accordance with claim 17, the configurable logic cell peripheral configurable via non-volatile memory.

22. A method in accordance with claim 21, wherein the non-volatile memory is statically connected for configuration.

23. A method in accordance with claim 21, wherein the non-volatile memory is read and configuration data is transferred to configuration registers for configuring the configurable logic cell peripheral.

24. A method in accordance with claim 21, wherein after initial configuration, the configuration of the configurable logic cell peripheral can be updated via software.

25. A processor in accordance with claim 4, the logic function block can be configured to form:
a first AND gate having two inputs coupled with a first and a second logic input and an output;
a second AND gate having two inputs coupled with a third and a fourth logic input and an output; and
an OR gate having two inputs coupled with the outputs of the first and second AND gate and having an output forming the logic output of the logic function block.

26. A processor in accordance with claim 4, the logic function block can be configured to form:
- a first OR gate having two inputs coupled with a first and a second logic input and an output;
- a second OR gate having two inputs coupled with a third and a fourth logic input and an output; and
- an XOR gate having two inputs coupled with the outputs of the first and second OR gate and having an output forming the logic output of the logic function block.

27. A processor in accordance with claim 4, the logic function block can be configured to form:
- an AND gate having four inputs coupled with a first, second, third and fourth logic input, respectively and an output forming the logic output of the logic function block.

28. A processor in accordance with claim 4, wherein the logic function block comprises four logic inputs and a single logic output and is configured to form a D-latch or a flip-flop, the logic function block can further be configured
- in a first mode, to form a D-flip-flop and
  - to directly couple the first logic input with a set input of the D-flip-flop,
  - to directly couple the second logic input with a data input of the D-flip-flop,
  - to directly couple the third logic input with a clock input of the D-flip-flop, and
  - to directly couple the fourth logic input with a reset input of the D-flip-flop, wherein an output of the D-flip-flop form the logic output of the logic function block;
- in a second mode, to form a D-flip-flop and
  - a first AND gate having two inputs coupled with the first and the second logic input and an output coupled with a set input of the D-flip-flop; and
  - a second AND gate having two inputs coupled with the third and the fourth logic input and an output coupled with a reset input of the D-flip-flop;
- in a third mode to form a D-flip-flop and
  - a first AND gate having two inputs coupled with the first and the second logic input and an output coupled with a data input of the D-flip-flop;
  - to directly couple the third logic input with a clock input of the D-flip-flop, and
  - to directly couple the fourth logic input with a reset input of the D-flip-flop, wherein an output of the D-flip-flop form the logic output of the logic function block;
- in a fourth mode to form a D-latch and
  - to directly couple the first logic input with a set input of the D-latch,
  - to directly couple the second logic input with a data input of the D-latch,
  - to directly couple the third logic input with a latch enable input of the D-latch, and
  - to directly couple the fourth logic input with a reset input of the D-latch, wherein an output of the D-latch form the logic output of the logic function block;
- and in a fifth mode to form a JK-flip-flop and
  - to directly couple the first logic input with a J input of the JK-flip-flop,
  - to directly couple the second logic input with a clock input of the JK-flip-flop,
  - to directly couple the third logic input with a K input of the JK-flip-flop, and
  - to directly couple the fourth logic input with a reset input of the JK-flip-flop, wherein an output of the JK-flip-flop form the logic output of the logic function block.

29. A processor in accordance with claim 28, wherein the logic function block can be further configured
- in a sixth mode to form
  - a first AND gate having two inputs coupled with a first and a second logic input and an output;
  - a second AND gate having two inputs coupled with a third and a fourth logic input and an output; and
  - an OR gate having two inputs coupled with the outputs of the first and second AND gate and having an output forming the logic output of the logic function block;
- in a seventh mode to form
  - a first OR gate having two inputs coupled with a first and a second logic input and an output;
  - a second OR gate having two inputs coupled with a third and a fourth logic input and an output; and
  - an XOR gate having two inputs coupled with the outputs of the first and second OR gate and having an output forming the logic output of the logic function block; and
- in a eighth mode to form
  - an AND gate having four inputs coupled with a first, second, third and fourth logic input, respectively and an output forming the logic output of the logic function block.

* * * * *

UNITED STATES PATENT AND TRADEMARK OFFICE
CERTIFICATE OF CORRECTION

| | | |
|---|---|---|
| PATENT NO. | : 8,710,863 B2 | Page 1 of 1 |
| APPLICATION NO. | : 13/449993 | |
| DATED | : April 29, 2014 | |
| INVENTOR(S) | : Kilzer et al. | |

It is certified that error appears in the above-identified patent and that said Letters Patent is hereby corrected as shown below:

In the Claims
Column 7,
Claim 18, line 63 "...foam the logic output of the logic function block..." ---
Change to--- "...form the logic output of the logic function block..."

Signed and Sealed this
Twenty-second Day of July, 2014

Michelle K. Lee
*Deputy Director of the United States Patent and Trademark Office*